United States Patent
Yu et al.

(10) Patent No.: US 11,915,743 B2
(45) Date of Patent: *Feb. 27, 2024

(54) LATCH CIRCUIT

(71) Applicant: Taiwan Semiconductor Manufacturing Company, Ltd., Hsinchu (TW)

(72) Inventors: Hua-Hsin Yu, Hsinchu (TW); Cheng Hung Lee, Hsinchu (TW); Hung-Jen Liao, Hsinchu (TW); Hau-Tai Shieh, Hsin-Chu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/201,636

(22) Filed: Mar. 15, 2021

(65) Prior Publication Data

US 2021/0201988 A1 Jul. 1, 2021

Related U.S. Application Data

(63) Continuation of application No. 16/507,805, filed on Jul. 10, 2019, now Pat. No. 10,950,296.

(Continued)

(51) Int. Cl.
*G11C 11/419* (2006.01)
*G11C 11/412* (2006.01)

(52) U.S. Cl.
CPC .......... *G11C 11/412* (2013.01); *G11C 11/419* (2013.01)

(58) Field of Classification Search
CPC ..... G11C 11/419; G11C 11/412; G11C 16/10; G11C 16/08; G11C 16/24; G11C 5/063
(Continued)

(56) References Cited

U.S. PATENT DOCUMENTS

| 5,748,643 A | 5/1998 | Pelella et al. |
| 6,917,536 B1 | 7/2005 | McLaury et al. |

(Continued)

FOREIGN PATENT DOCUMENTS

| CN | 100437834 C | 11/2008 |
| CN | 104299644 A | 1/2015 |

(Continued)

*Primary Examiner* — Sung Il Cho
(74) *Attorney, Agent, or Firm* — MERCHANT & GOULD P.C.

(57) ABSTRACT

A latch formed from a memory cell includes a clock input terminal configured to receive a clock signal, complementary first and second data terminals, and a latch circuit. The latch circuit has first and second inverters. The first inverter has an input terminal coupled to the first data terminal, and the second inverter has an input terminal coupled to the second data terminal. A first pass gate transistor is coupled between an output terminal of the second inverter and the first data terminal. A second pass gate transistor is coupled between an output terminal of the first inverter and the second data terminal. The first and second pass gate transistors each have a gate terminal coupled to the clock input terminal. The input terminal of the first inverter is not directly connected to the output terminal of the second inverter, and the input terminal of the second inverter is not directly connected to the output terminal of the first inverter.

21 Claims, 13 Drawing Sheets

Related U.S. Application Data

(60) Provisional application No. 62/698,865, filed on Jul. 16, 2018.

(58) Field of Classification Search
USPC .......................................... 365/156
See application file for complete search history.

(56) References Cited

U.S. PATENT DOCUMENTS

| | | | |
|---|---|---|---|
| 7,259,064 B2 | 8/2007 | Korber | |
| 7,876,602 B2 | 1/2011 | Lawrence et al. | |
| 8,030,713 B2 | 10/2011 | Hiraoka et al. | |
| 8,498,143 B2 | 7/2013 | Deng | |
| 8,804,445 B2 | 8/2014 | Chuang et al. | |
| 9,159,402 B2 | 10/2015 | Asthana et al. | |
| 9,858,985 B2 | 1/2018 | Liaw | |
| 10,446,223 B1 * | 10/2019 | Nebesnyi | G11C 11/412 |
| 10,950,296 B2 | 3/2021 | Yu et al. | |
| 2004/0114424 A1 * | 6/2004 | Yoshida | G11C 29/02 |
| | | | 365/154 |
| 2010/0264465 A1 * | 10/2010 | Houston | H01L 27/1207 |
| | | | 257/E21.602 |
| 2014/0379977 A1 | 12/2014 | Perner | |
| 2015/0162075 A1 * | 6/2015 | Perner | G11C 11/419 |
| | | | 365/154 |
| 2018/0024758 A1 * | 1/2018 | Wang | G11C 7/227 |
| | | | 711/103 |
| 2018/0138092 A1 * | 5/2018 | Lee | H01L 27/088 |
| 2018/0190344 A1 | 7/2018 | Tseng et al. | |
| 2019/0067301 A1 * | 2/2019 | Yang | H01L 29/785 |

FOREIGN PATENT DOCUMENTS

| | | |
|---|---|---|
| CN | 106601288 A | 4/2017 |
| KR | 10-2005-0107786 A | 11/2005 |
| KR | 10-2014-0116177 A | 10/2014 |
| WO | 2004/081948 A1 | 9/2004 |
| WO | 2013/115778 A1 | 8/2013 |
| WO | 2016/153633 A1 | 9/2016 |

* cited by examiner

| CLK | CLKB | Data Input | | Master Latch | | Slave Latch | |
|---|---|---|---|---|---|---|---|
| | | Din_T | Din_C | MQ (MBL) | MQB (MBLB) | SQ (SBL) | SQB (SBLB) |
| 0 | 1 | 0 | 1 | 0 | 1 | previous SQ | previous SQB |
| 0 | 1 | 1 | 0 | 1 | 0 | previous SQ | previous SQB |
| 1 | 0 | NA | NA | previous MQ | previous MQB | write by MBL | write by MBLB |

LATCH CIRCUIT

CROSS-REFERENCE TO RELATED APPLICATION

This application is a continuation of U.S. patent application Ser. No. 16/507,805, filed Jul. 10, 2019, now U.S. Pat. No. 10,950,296, which claims the benefit of U.S. Provisional Patent Application No. 62/698,865, filed Jul. 16, 2018, the disclosures of which are hereby incorporated by reference.

BACKGROUND

A common type of integrated circuit memory is a static random access memory (SRAM) device. A typical SRAM memory device has an array of memory cells, or "bit-cells". In some examples, each memory cell uses six transistors connected between an upper reference potential and a lower reference potential (typically ground) such that one of two storage nodes can be occupied by the information to be stored, with the complementary information stored at the other storage node. Each bit in the SRAM cell is stored on four of the transistors, which form two cross-coupled inverters. The other two transistors are connected to the memory cell word line to control access to the memory cell during read and write operations by selectively connecting the cell to its bit lines. In a read operation, for example, the memory cell bit lines are precharged to a predefined threshold voltage. When the word line is enabled, a sense amplifier connected to the bit lines senses and outputs stored information. Input/output circuitry connected to the bit lines, such as a latch, are often used when processing memory cell data. Such circuitry is often located in periphery areas that are outside of, and peripheral to, the area of the array of memory cells.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. In addition, the drawings are illustrative as examples of embodiments of the invention and are not intended to be limiting.

FIG. 8C is a truth table illustrating the operation of the example flip-flops shown in FIGS. 8A and 8B according to some embodiments.

DETAILED DESCRIPTION

Figure 1A:
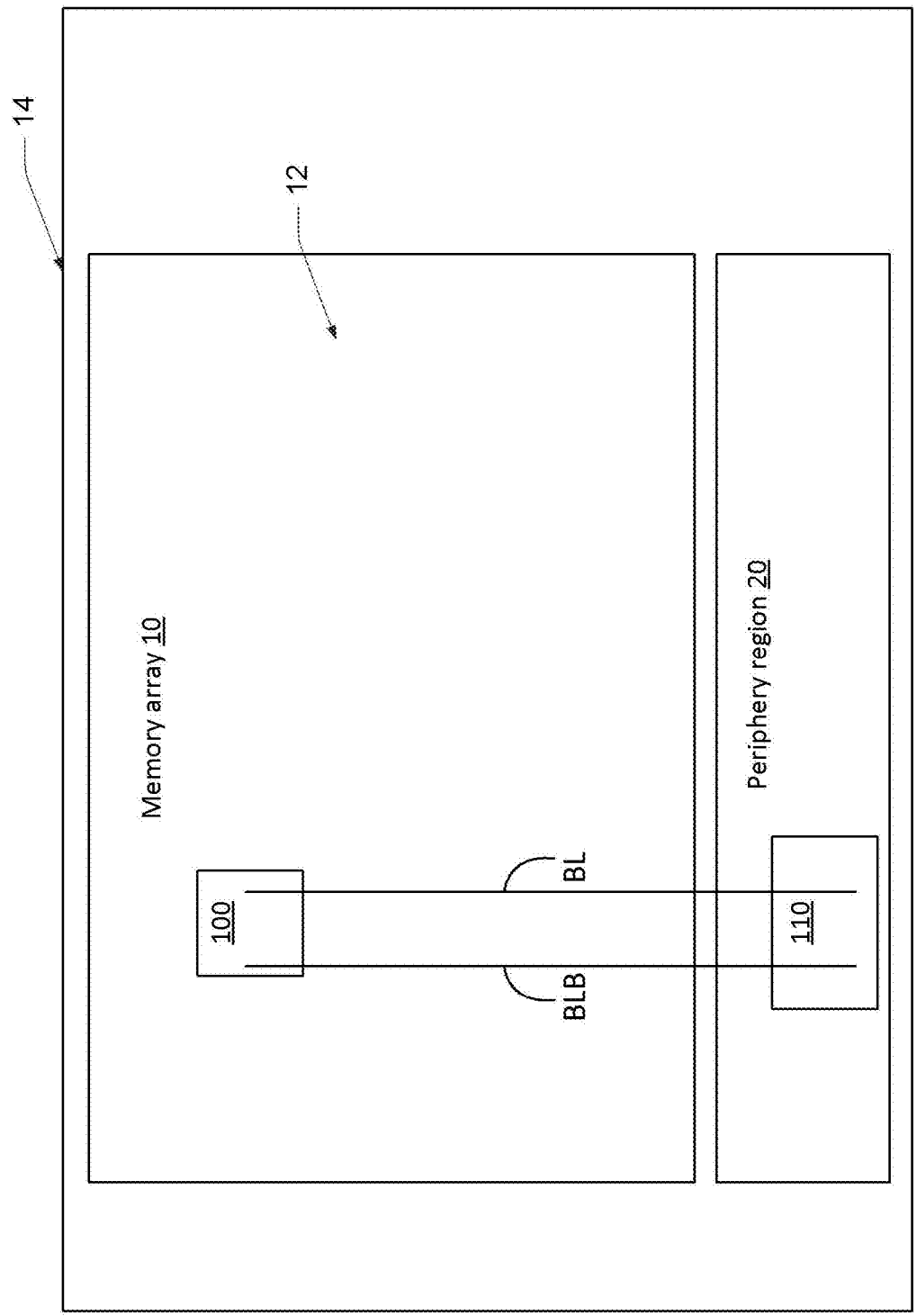
FIG. 1A is a block diagram illustrating an example of an integrated circuit device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A static random access memory (SRAM) device has an array of memory cells that include transistors connected between an upper reference potential and a lower reference potential such that one of two storage nodes can be occupied by the information to be stored, with the complementary information stored at the other storage node. For example, one typical SRAM memory cell arrangement includes six transistors. Each bit in the SRAM cell is stored on four of the transistors, which form two cross-coupled inverters. The other two transistors are connected to the memory cell word line to control access to the memory cell during read and write operations by selectively connecting the cell to its bit lines.

In a read operation, for example, the memory cell bit lines are precharged to a predefined threshold voltage. When the word line is enabled, a sense amplifier connected to the bit lines senses and outputs stored information. In some examples, data on the bit line is latched, and the latch is set to maintain the bit line output for a sufficient time period to allow for input-output (I/O) operations to occur.

In some semiconductor memory devices, memory arrays are separated from each other by straps. Straps may also serve as pick-up areas formed with circuits to facilitate the access operation of memory cells. In some existing memory devices, the number of memory arrays and hence the number of straps, is relatively large. A large number of periodically recurring straps may disadvantageously affect array efficiency, in view of the increasing concern of area cost in advanced semiconductor manufacturing. In addition, areas peripheral to the memory arrays may contain word line drivers, edge cell regions, control circuits, and local input/output circuit regions. Such peripheral areas often contain peripheral circuits such as read sensing circuits, write driving circuits, drivers, decoders, latches, sense amplifiers, buffers, pre-charging circuits and multiplexers. For very large scale integration (VLSI) devices, components of peripheral circuits are often constructed according to periphery layout rules as part of programs following design for manufacturing (DFM) methodologies to improve yields and reliability. For example, since there are comparatively vastly fewer peripheral circuits/elements as compared to the memory cells (e.g. less redundancy), and each such peripheral circuits often processes signals/data of many memory elements, the reliability tolerances placed on peripheral circuits/elements are often much more strict. In addition, peripheral layout rules must be able to reliably accommodate fabrication of a comparatively much larger combination of circuitry than memory array bit-cells in a bit-cell region of the device, which typically repeat a limited combination of circuitry in as little area as possible. As such, periphery layout rules, in order to minimize defects and maintain strict reliability tolerances, result in circuit elements that are comparatively larger in area than equivalent elements formed according to bit-cell layout rules. Conversely, bit-cell layout rules focus on minimizing bit-cell area to maximize bit-cell density, resulting in circuit elements that are comparatively smaller in area than equivalent peripheral counterparts.

FIG. 1A is a block diagram illustrating aspects of an example memory device. FIG. 1A shows a memory array 10 with a plurality of memory cells or bit-cells (for simplicity, a single bit-cell 100 is shown) arranged in a bit-cell region 12 of a substrate 14, and a periphery region 20 outside the bit-cell region 12. A periphery circuit 110 may be located within periphery region 20 as discussed above. The memory cell 100 and the periphery circuit 110 may be coupled by bit lines BL and BLB. The periphery circuit 110 may be any circuit including, for example, a latch or a flip-flop. A traditional latch consists of back-to-back inverters and a MUX with a gating clock, and is typically formed in accordance with a periphery layout rule. In accordance with the present disclosure, a latch completed by a bit-cell layout rule may be completed within the area of the memory array 10, and may be completed using components of memory cells within the array. A latch completed by a bit-cell layout rule results in more efficient use of area, faster data propagation because of the read-out/data-in latch being located just next to the bit-cell array, and power savings because of a shorter data path with a smaller parasitic RC.

In accordance with some disclosed embodiments, a latch or flip-flop is formed from an SRAM bit-cell or bit-cells in the bit-cell region 12 according to a bit-cell layout rule. In some embodiments, forming a latch or flip-flop from a SRAM bit-cell or bit-cells according to a bit-cell layout rule saves area in the memory device, as compared with latches or flip-flops formed according to periphery layout rules. In some embodiments, forming a latch from a SRAM bit-cell according to a bit-cell layout rule results in area savings of 40%, or 60%, over forming a latch in a periphery region according to a periphery layout rule. In some embodiments, forming a latch or flip-flop from a SRAM bit-cell or bit-cells according to a bit-cell layout rule increases data propagation speed and reduces memory device power consumption because such SRAM bit-cell latches and flip-flops can be located more closely to, or just next to, a bit-cell array, shortening the data path and circuit connections of the latch or flip-flop and reducing parasitic RC effects, e.g. reducing the parasitic resistance, capacitance, and inductance arising from electrical interconnects.

Figure 1B:
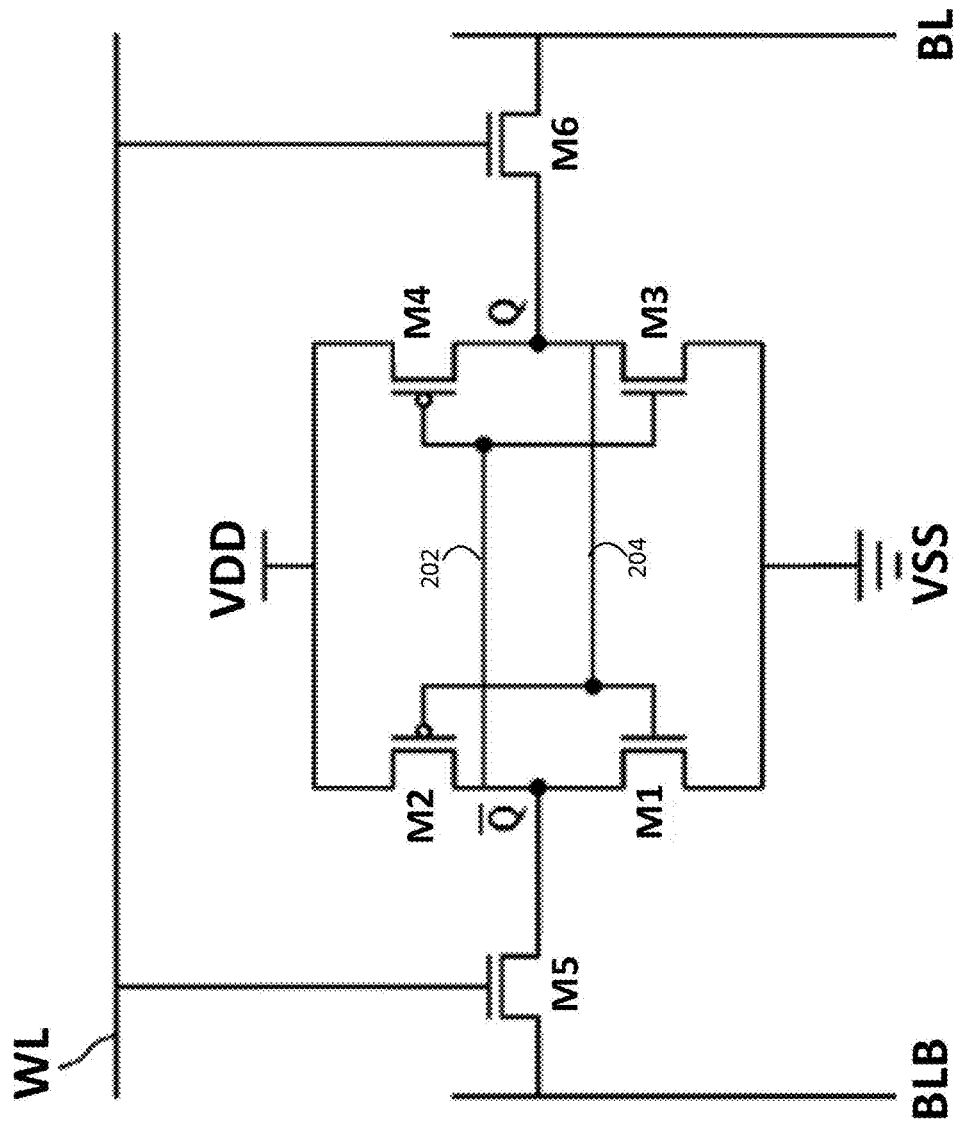
FIG. 1B is a circuit diagram illustrating an example 6T memory cell used in some disclosed examples in accordance with some embodiments.

FIG. 1B is a circuit diagram illustrating an example memory cell which may be employed in some disclosed embodiments. The memory cell 100 includes but is not limited to a six-transistor (6T) SRAM structure. In some embodiments more or fewer than six transistors may be used to implement the memory cell 100. For example, the memory cell 100 in some embodiments may use a 4T, 8T or 10T SRAM structure, and in other embodiments may include a memory-like bit-cell or a building unit. The memory cell 100 includes a first inverter formed by a NMOS/PMOS transistor pair M1 and M2, a second inverter formed by a NMOS/PMOS transistor pair M3 and M4, and access transistors/pass gates M5 and M6. Transistors M1, M3, M5 and M6 include n-type metal-oxide-semiconductor (NMOS) transistors, and transistors M2 and M4 include p-type metal-oxide semiconductor (PMOS) transistors.

The first and second inverters are cross coupled to each other via cross-coupling lines 202 and 204 to form a latching circuit for data storage. For example, the cross-coupling line 202 is coupled between the second terminals of the first inverter transistor pair, e.g. M1 and M2, and the gates of the second inverter transistor pair, e.g. M3 and M4. Similarly, the cross-coupling line 204 is coupled between the second terminals of the second inverter transistor pair, e.g. M3 and M4, and the gates of the first inverter transistor pair, e.g. M1 and M2. As such, the output of the first inverter at the node Qbar is coupled to the input of the second inverter, and the output of the second inverter a the node Q is coupled to the input of the first inverter. Power is supplied to each of the inverters, for example, a first terminal of each of transistors M2 and M4 is coupled to a power supply VDD, while a first terminal of each of transistors M1 and M3 is coupled to a reference Voltage VSS, for example, ground. A bit of data is stored in the memory cell 100 as a voltage level at the node Q, and can be read by circuitry via the bit line BL. Access to the node Q is controlled by the pass gate transistor M6. The mode Qbar stores the complement to value at Q, e.g. if Q is "high," Qbar will be "low," and access to Qbar is controlled by the pass gate transistor M5.

A gate of the pass gate transistor M6 is coupled to a word line WL. A first source/drain of the pass gate transistor M6 is coupled to a bit line BL, and a second source/drain terminal of the pass gate transistor M6 is coupled to second terminals of transistors M4 and M3 at the node Q.

Similarly, a gate of the pass gate transistor M5 is coupled to the word line WL. A first source/drain terminal of the pass gate transistor M5 is coupled to a complementary bit line BLB, and a second source/drain first terminal of the pass gate transistor M5 is coupled to second terminals of transistors M2 and M1 at the node Qbar.

Figure 2A:
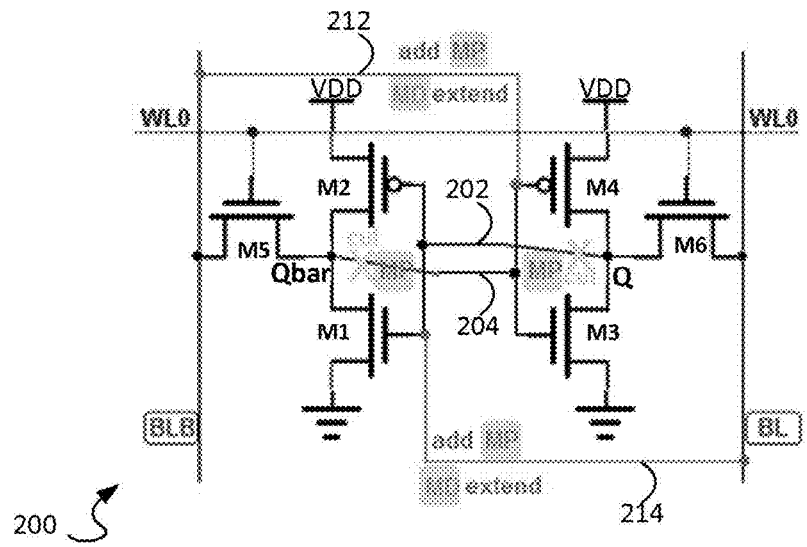
FIG. 2A is a circuit diagram illustrating an example of modifications that can be made to a 6T memory cell to form a latch circuit in accordance with some embodiments.

FIG. 2A is a circuit diagram illustrating an example of modifications that can be made to a memory cell, such as the memory cell 100 shown in FIG. 1B, to form a latch circuit 200 in accordance with some embodiments. In the example shown, the latch circuit 200 includes, but is not limited to, a six-transistor (6T) SRAM structure. For example, the latch circuit 200 in other embodiments may use a 4T, 8T or 10T SRAM structure, and in other embodiments may include a memory-like bit-cell or a building unit. In the illustrated examples, the transistors M1, M3, M5 and M6 include n-type metal-oxide-semiconductor (NMOS) transistors, and transistors M2 and M4 include p-type metal-oxide-semiconductor (PMOS) transistors.

The latch circuit 200 includes a first inverter formed by an NMOS/PMOS transistor pair M1, M2, a second inverter formed by an NMOS/PMOS transistor pair M3, M4, and access transistors/pass gates M5 and M6. In the example shown, the cross-coupling lines 202 and 204 are omitted, or alternatively removed, cut, or never connected or coupled. By comparison with the memory cell 100, omitting the cross-coupling line 204 decouples the output the first inverter at the node Qbar, e.g. the second terminals of the transistors M1 and M2, from the input of the second inverter, e.g. the gates of the transistors M3 and M4. Similarly, removing the cross-coupling line 202 decouples the output the second inverter at the node Q, e.g. the second terminals of the transistors M3 and M4, from the input of the first inverter, e.g. the gates of the transistors M1 and M2. In some embodiments, the cross-coupling lines 202 and 204 reside in a metal-on-poly (MP) layer of the memory device, and the omitting cross-coupling lines 202 and 204 to form the latch circuit 200 includes a modification of the MP layer. In addition, in the example shown in FIG. 2A the input of the first inverter, e.g. the gates of the transistors M1 and M2, is coupled to the bit line BL via the coupling line 214 and the input of the second inverter, e.g. the gates of the transistors M3 and M4, is coupled to the complementary bit line BLB via the coupling line 212. In some embodiments, the coupling lines 212 and 214 reside in a metal-on-drain (MD) layer of the memory device, and extending the coupling lines 212 and 214 includes a modification of the MD layer. As such, in some embodiments, the latch circuit 200 may be formed by only modifying the MP layers and/or MD layers of the 6T SRAM structure of the memory cell 100. Further details regarding the layer structure of the latch circuit 200 are described below relative to FIG. 2B.

Figure 2B:
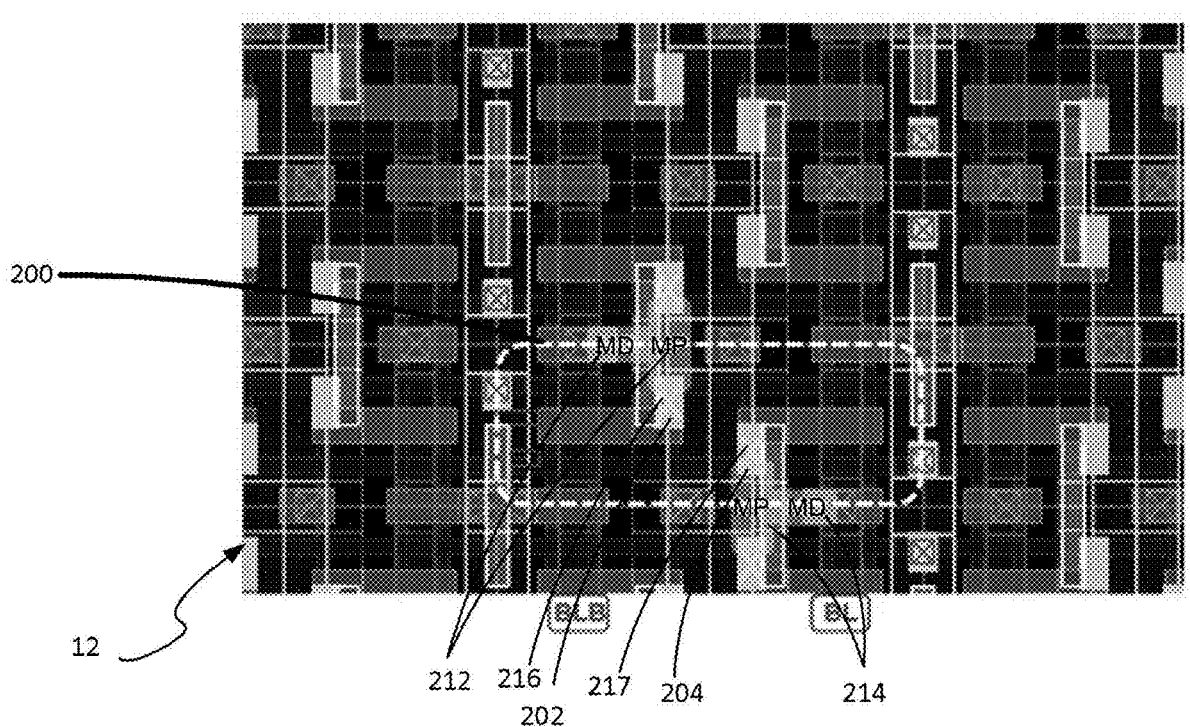
FIG. 2B is a layout diagram illustrating an example of layer modifications that can be made to a 6T memory cell to form a latch circuit in accordance with some embodiments.

FIG. 2B illustrates modifications made to the layer structure of a memory cell 100 to form an example latch circuit 200 as discussed in conjunction with FIGS. 1B and 2A above. In the example shown, the cross-coupling line 202 is "cut" to remove the direct gate connections of the M1 and M2 transistors from the node Q, e.g. the drains of the M3, M4, and M6 transistors, at the location 216 illustrated in FIG. 2B. Similarly, the cross-coupling line 204 is "cut" to remove the gate connections of the M3 and M4 transistors from the node Qbar, e.g. the drains of the M1, M2, and M5 transistors, at the location 217 illustrated in FIG. 2B. Further, in the embodiment shown, the coupling line 212 is formed by extending the MD layer connection and adding the MP layer connection, and the coupling line 214 is formed by extending the MD layer connection and adding the MP layer connection.

Figure 3A:
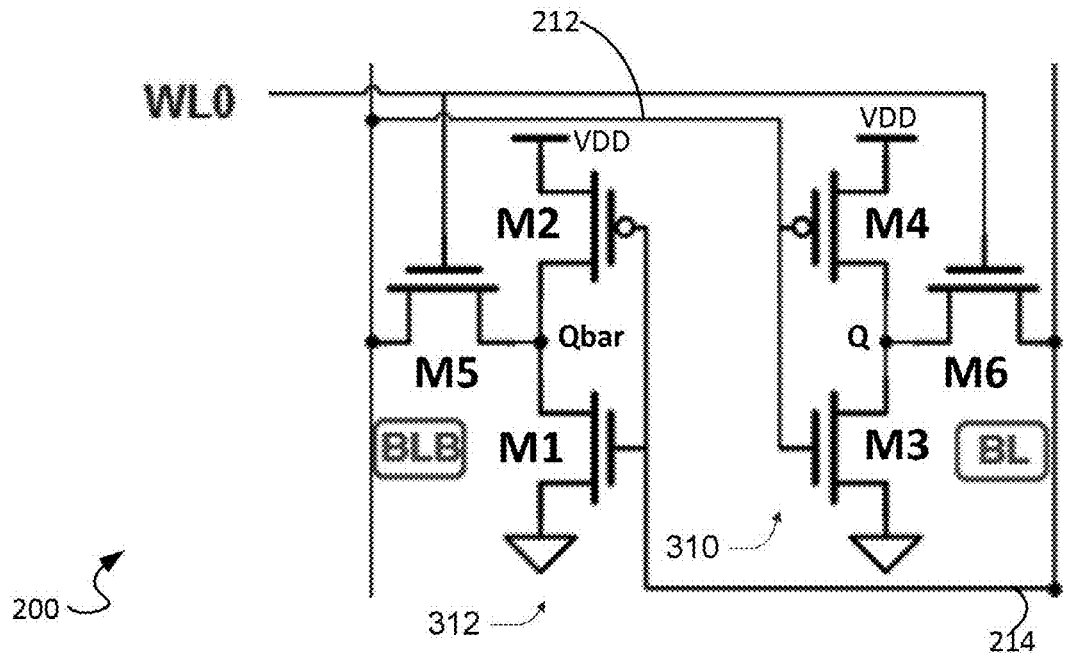
FIG. 3A is a circuit diagram illustrating an example latch utilizing a latch circuit in accordance with some embodiments.
Figure 3B:
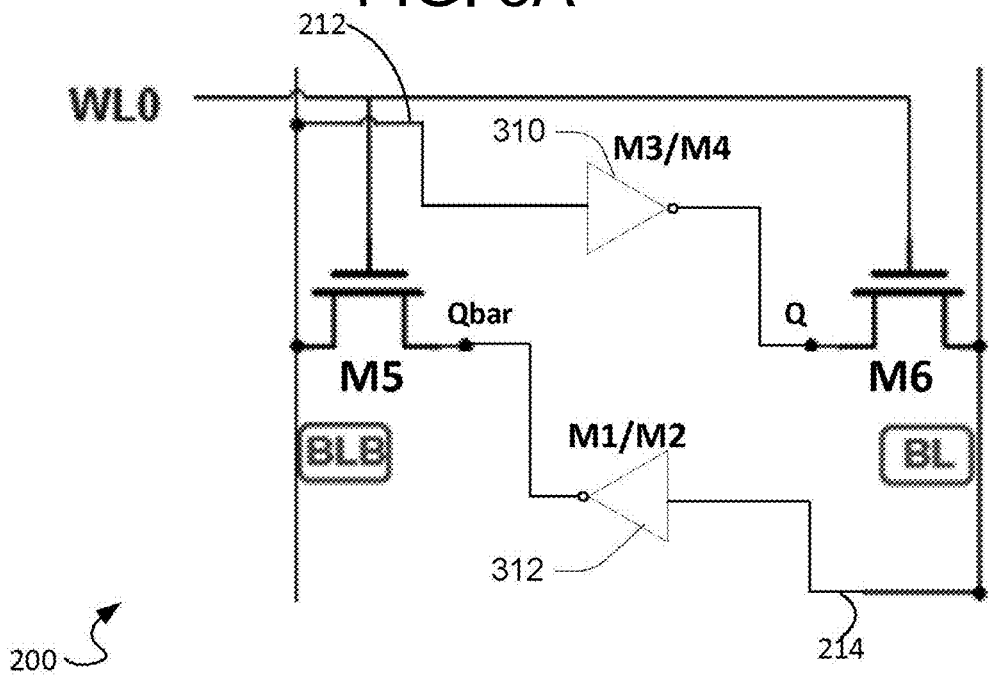
FIG. 3B is a circuit diagram illustrating another example latch circuit in accordance with some embodiments.

FIG. 3A is an example of the latch circuit 200 following the modifications discussed in conjunction with FIGS. 2A and 2B. FIG. 3B shows a simplified version of the latch circuit shown in FIG. 3A showing the NMOS/PMOS transistor pairs M3, M4 and M1, M2 as first and second inverters 310, 312. The cross-coupling lines 202 and 204 shown in FIG. 1B are omitted in FIG. 3A following removal thereof as shown in FIGS. 2A and 2B, such that the inverters formed by the transistors M1 to M4 are uncoupled as shown in FIG. 3A. In other words, the input terminal of the first inverter 310 is not directly connected to the output terminal of the second inverter 312 (node Q), and the input terminal of the second inverter 312 is not directly connected to the output terminal of the first inverter 310 (node Qbar). In addition, the latch circuit 200 has the coupling lines 212 and 214 are extended, with the coupling line 214 coupling the inverter formed by the NMOS/PMOS transistor pair M1 and M2 to the bit line BL, and the coupling line 212 coupling the inverter formed by the NMOS/PMOS transistor pair M3 and M4 to the complementary bit line BLB in accordance with the modifications shown in FIGS. 2A and 2B.

Figure 4:
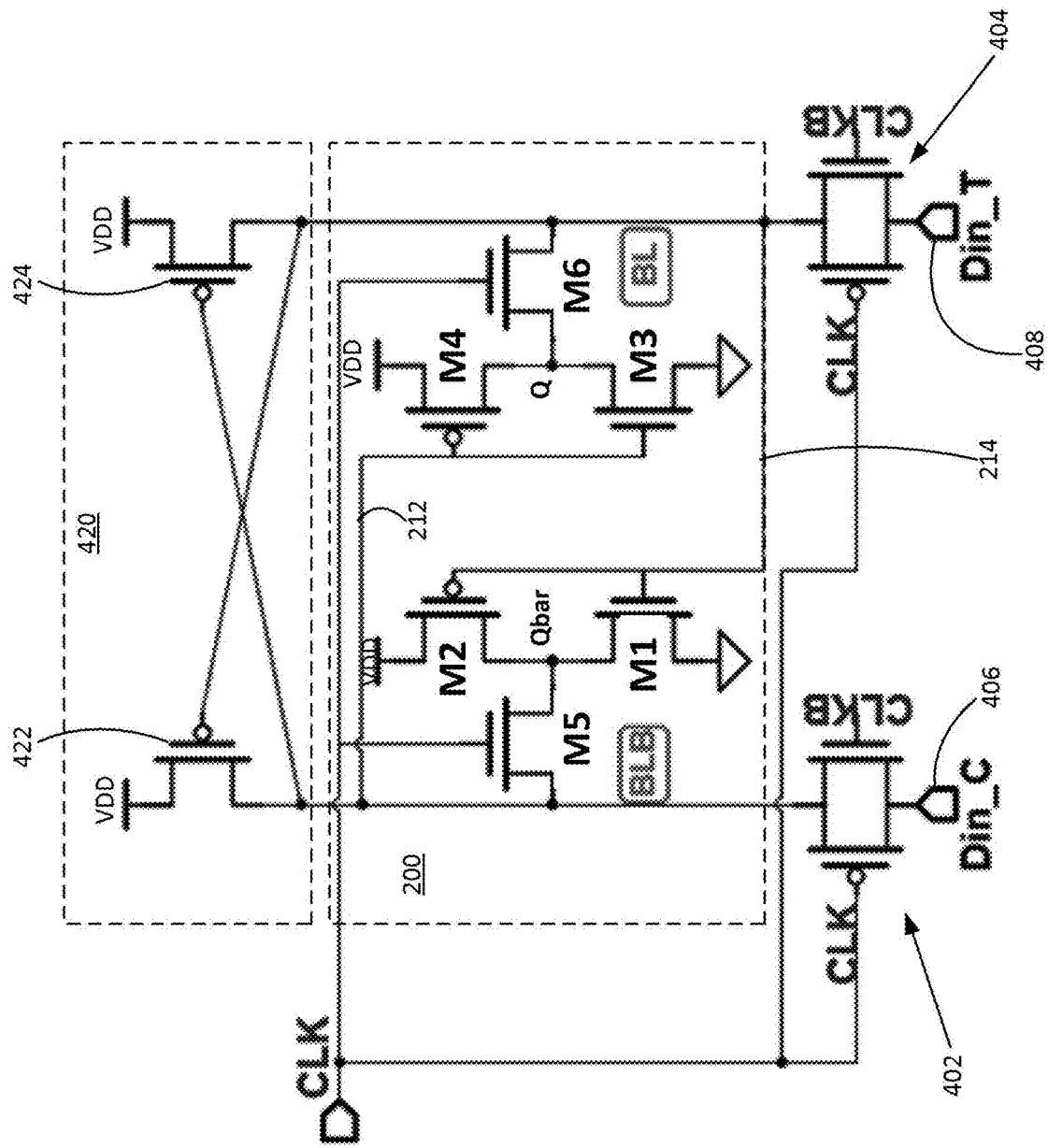
FIG. 4 is a circuit diagram illustrating an example latch utilizing a latch circuit in accordance with some embodiments

FIG. 4 is a circuit diagram illustrating an example latch 400 utilizing the latch circuit 200 in accordance with some embodiments. In the example shown, the latch 400 includes the latch circuit 200, a cross-coupled P circuit 420, and a data input circuit including transmission gates 402 and 404. A clock line is formed by the word line WL0 (as shown in FIG. 3A) of the memory cell, and data input terminals 406 and 408 receive complementary data inputs Din_C and Din_T, respectively. The latch circuit 200 is operatively coupled to the cross-coupled P circuit 420 and transmission gates 402 and 404 via the bit line BL and the complementary bit line BLB. In the embodiment shown, the cross-coupled P circuit 420 contains two PMOS transistors 422 and 424, both having a first terminal coupled to an input voltage terminal VDD. The PMOS transistor 422 has a gate coupled to the bit line BL and a second terminal coupled to the complementary bit line BLB, and the PMOS transistor 424 has a gate coupled to the complementary bit line BLB and a second terminal coupled to the bit line BL. The transmission gate 404 is coupled to the bit line BL and the transmission gate 402 is coupled to the complementary bit line BLB. I/O data signals corresponding to read/write operations involving the latch 400 are controlled by the transmission gates 402 and 404, which both open allowing for transmission of data from data terminals 406 and 408 on clock low, and close on clock high signals. Data is held, or latched, in latch 400 when the clock line CLK is high. Upon a clock high signal, the access transistors M5 and M6 are turned on and the bit line BL and the complementary bit line BLB receive the values at Q and Qbar, respectively, and the bit lines BL and BLB are isolated from the data terminals 406 and 408 by the transmission gates 402 and 404, which are closed. For a latched logical 1, the voltage at Q and BL is high, turning off the PMOS transistor 422 and the PMOS transistor M2, and turning on the NMOS transistor M1, which pulls Qbar and BLB low. A low BLB opens both the PMOS transistor 424 and the PMOS transistor M4, closes the NMOS transistor M3, and consequently pulls up and reinforces the logical high on BL and at storage node Q. Upon a clock low, the transmission gates 402 and 408 404 open for read/write operations, and closing access transistors M5 and M6. If a logical 0 is to be written to the latch, the data terminal 408 pulls the voltage on BL down, opening the PMOS transistor 422 and pulling up the voltage on BLB, and also opening the PMOS transistor M2 and closing the transistor M1, pulling up Qbar. The high on BLB then closes PMOS transistors 424 and M4, and opens the NMOS transistor M3 thereby pulling storage node Q down.

Figure 5:
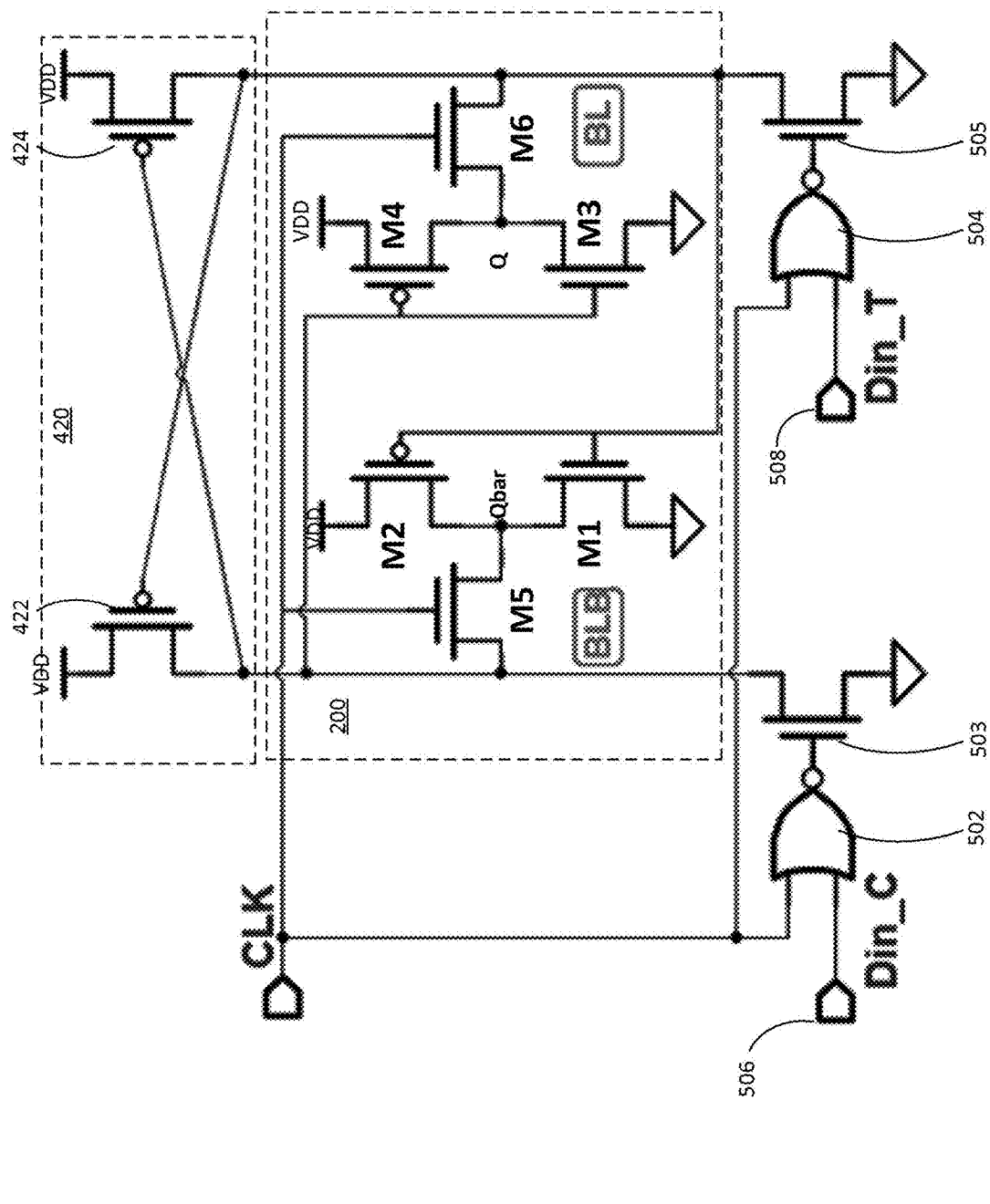
FIG. 5 is a circuit diagram illustrating an example latch in accordance some embodiments.

FIG. 5 is a circuit diagram illustrating an example latch 500 utilizing the latch circuit 200 in according to another embodiment. In the example shown, the latch 500 includes the latch circuit 200, and the cross-coupled P circuit 420. An input circuit includes NOR gates 502 and 504, NMOS transistors 503 and 505, and data input terminals 506 and 508 receiving the complementary data inputs Din_C and Din_T, respectively. A clock line is formed by the word line WL0 of the memory cell. The latch circuit 200 is operatively coupled to the cross-coupled P circuit 420 and first terminals of transistors 503 and 505 via the bit line BL and the complementary bit line BLB. In the embodiment shown, the output of the NOR gate 504 is coupled to a gate of the transistor 505, and the inputs of the NOR gate 504 are coupled to the clock line and the data terminal 508. In addition, the output of the NOR gate 502 is coupled to a gate of the transistor 503, and the inputs of the NOR gate 502 are coupled to the clock line and the complementary data terminal 506. The second terminals of both transistors 503 and 505 are coupled to ground. In the example shown, the NOR gates 502 and 504 and the transistors 503 and 505 act as an enable for the latch 500. When the clock line signal CLK is high, data is latched on the latch 500. When the clock line signal CLK is low, BL or BLB are pulled low depending on the data signal from the data terminals 506 and 508. Upon a data high signal (still with CLK low), the data terminal 508 is high resulting in a low output from the NOR gate 504 and closing the transistor 505. The complementary data terminal 506 is low, resulting in a high output from the NOR gate 502, opening the transistor 503 and pulling BLB low. As noted above, the cross-coupled P circuit 420 acts to reinforce a high signal by opening the transistor 424, which consequently closes the transistor 422 if it was not already closed. In addition, as above, the low on BLB opens the transistor M4 and closes the transistor M3, pulling the storage node Q high. The high on BL closes the transistor M2 and opens the transistor M1, pulling the complementary storage node Qbar low.

Figure 6A:
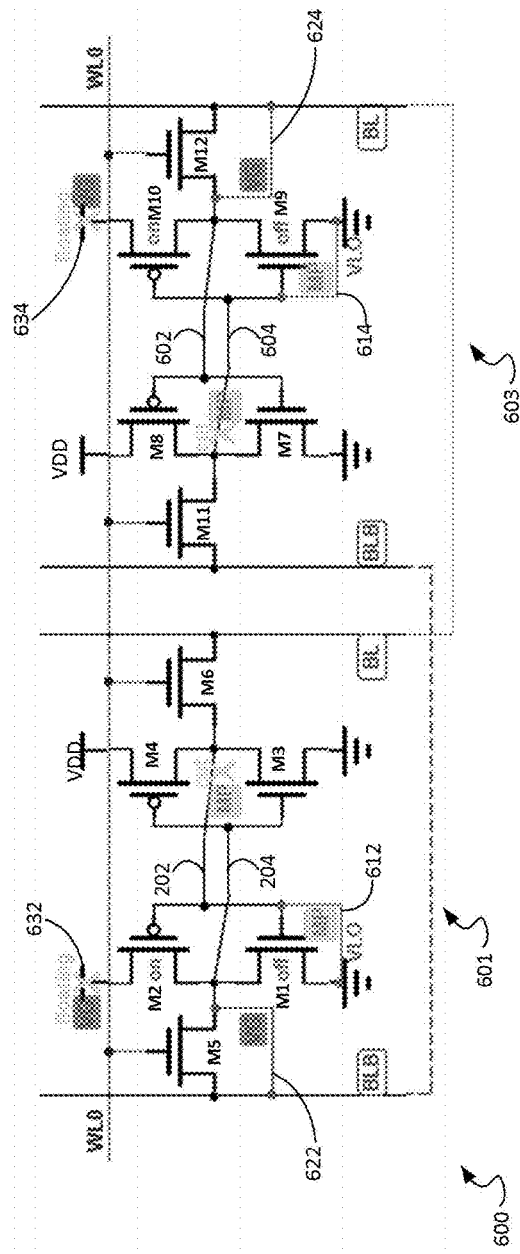
FIG. 6A is a circuit layout diagram illustrating an example of modifications that can be made to two 6T memory cells to form a latch circuit in accordance with some embodiments

FIG. 6A is a circuit diagram illustrating an example of modifications that can be made to two memory cells, e.g. two of the memory cells 100 as illustrated in FIG. 1B, to form a latch circuit 600 in accordance with some embodiments. In the example shown, the latch circuit 600 includes, but is not limited to, two six-transistor (6T) SRAM structures. For example, the latch circuit 600 in other embodiments may use a 4T, 8T or 10T SRAM structure, and in other embodiments may include a memory-like bit-cell or a building unit. In the illustrated examples, the transistors M1, M3, M5, M6, M7, M9, M11, and M12 include n-type metal-oxide-semiconductor (NMOS) transistors, and transistors M2, M4, M8 and M10 include p-type metal-oxide-semiconductor (PMOS) transistors.

As shown in the example, the bit lines BL of a first 6T bit-cell 601 and a second 6T bit-cell 603 are coupled. Also as shown in the example, the complementary bit lines BLB of both bit-cells 601 and 603 are coupled. The coupling line 202 of the first bit-cell 601 is omitted, and the coupling line 604 of the second bit-cell 603 is omitted. In contrast with the latch circuit 200, however, the coupling lines 204 and 602 remain in the first and second bit-cells 601 and 603, respectively. The first terminal 632 of the PMOS transistor M2 and the first terminal 634 of the PMOS transistor M10 are decoupled from VDD and are left floating. The coupling lines 612 and 614 couple the gates of the transistors M1, M2, M9, and M10 to ground, which results in the PMOS transistors M2 and M10 being held on and the NMOS transistors M1 and M9 being held off. The coupling lines 622 and 624 are added to couple the first terminals of the access transistors M5 and M12 to the complementary bit line BLB and the bit line BL, respectively, effectively bypassing the access transistors M5 and M12. The resulting latch circuit 600 is similar to the latch circuit 200, and is functionally equivalent to the latch circuit 200.

Figure 6B:
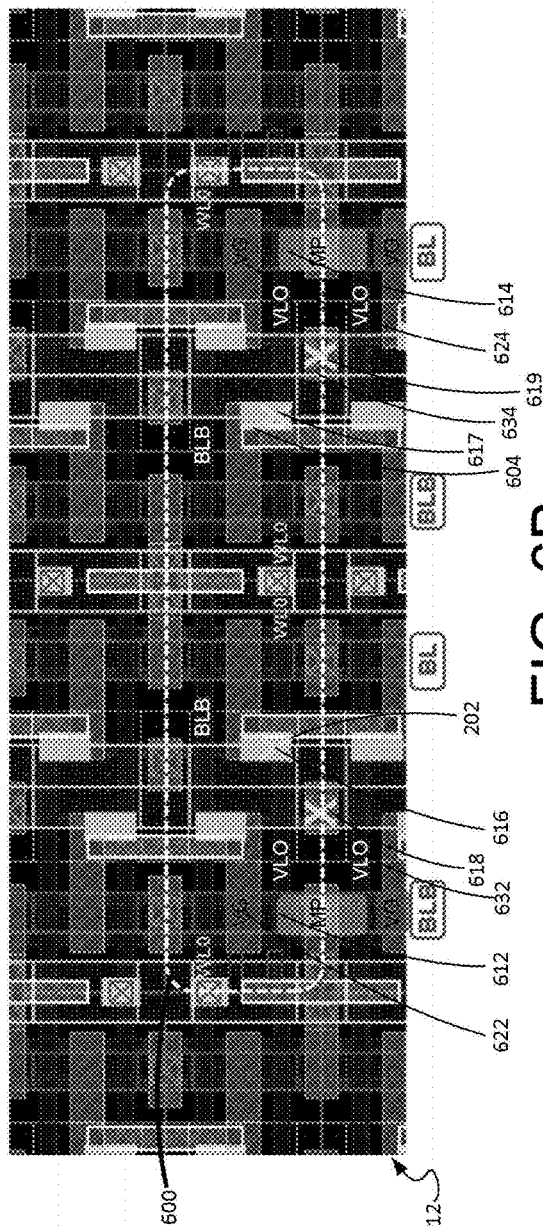
FIG. 6B is a layout diagram illustrating an example of layer modifications that can be made to a pair of 6T memory cells to form a latch circuit in accordance with some embodiments.

FIG. 6B is a layer structure diagram illustrating the modifications made to the memory cells 601 and 603 to form the example latch circuit 600 described above. In the example shown, the cross-coupling line 202 is "cut" to remove the direct gate connections of the M1 and M2 transistors from the node Q, e.g. the drains of the M3, M4, and M6 transistors, at the location 616 illustrated in FIG. 6B. Similarly, the cross-coupling line 604 is "cut" to remove the gate connections of the M9 and M10 transistors from the node Qbar, e.g. the drains of the M7, M8, and M11 transistors, at the location 617 illustrated in FIG. 6B. The terminal connection between the transistor M2 source/drain terminal 632 and VDD, as well as the terminal connection between the transistor M10 source/drain terminal 634 and VDD, are "cut" at the locations 618, 619 illustrated in FIG. 6B. The coupling lines 612 and 614 are formed by extending their MP layer connections as shown in FIG. 6B, thereby coupling the gates of the transistors M1, M2, M9, and M10 to ground as described above in relation to FIG. 6A. The coupling lines 622 and 624 are added in the VG layer as shown in FIG. 6B, thereby coupling the first terminals of the access transistors M5 and M12 to the complementary bit line BLB and the bit line BL, respectively. Thus, the latch circuit 600 may be formed by modifying only the MP and VG layers of the memory device, and has the advantage of not needing to move or change the MD layer.

As illustrated in both FIGS. 6A and 6B, the cross-coupling lines 202 and 604 in the MP layer are omitted, the first terminals 632 and 634 of the PMOS transistors M2 and M10 are decoupled in the VG layer from VDD, the coupling lines 612 and 614 are extended in the MP layer to couple the gates of transistors M1, M2, M9 and M10 to ground, and the coupling lines 622 and 624 are added in the VG layer to couple the first terminals of the access transistors M5 and M12 to the complementary bit lines BLB and BL, respectively.

Figure 7A:
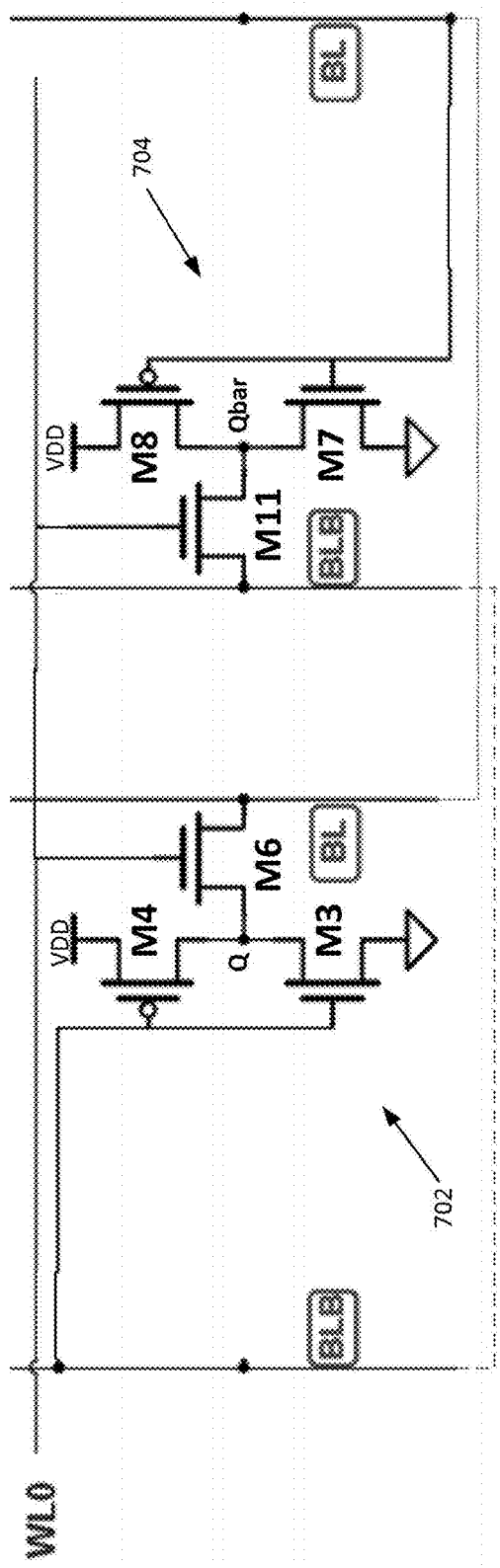
FIG. 7A is a circuit diagram illustrating an example latch circuit in accordance with some embodiments.
Figure 7B:
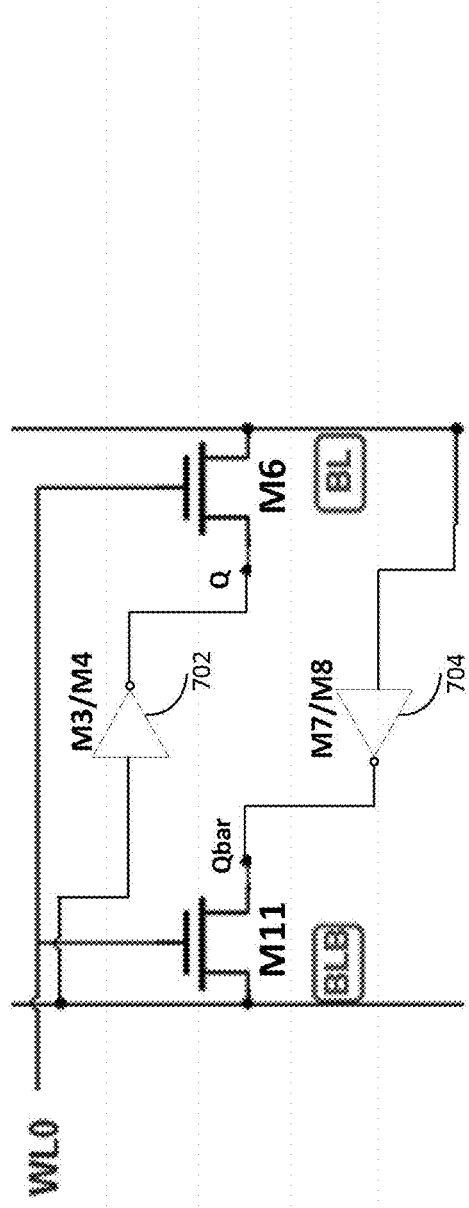
FIG. 7B is a circuit diagram illustrating another example latch circuit in accordance with some embodiments.

FIG. 7A is a circuit diagram illustrating an example of the resulting latch circuit 600 from the modifications shown in FIGS. 6A and 6B in accordance with some embodiments. The example shown in FIG. 7A is functionally equivalent to the example of FIG. 6A after the modifications described above have been made. FIG. 7B is a circuit diagram showing a simplified view of the latch circuit 600 shown in FIG. 7A, and explicitly shows the NMOS/PMOS transistor pairs M3, M4 and M7, M8 inverters 702, 704 that are cross-coupled via the bit line BL and the complementary bit line BLB. In addition, FIG. 7B shows that the access transistors M6 and M11 control access to nodes Q and Qbar, respectively.

Figure 8A:
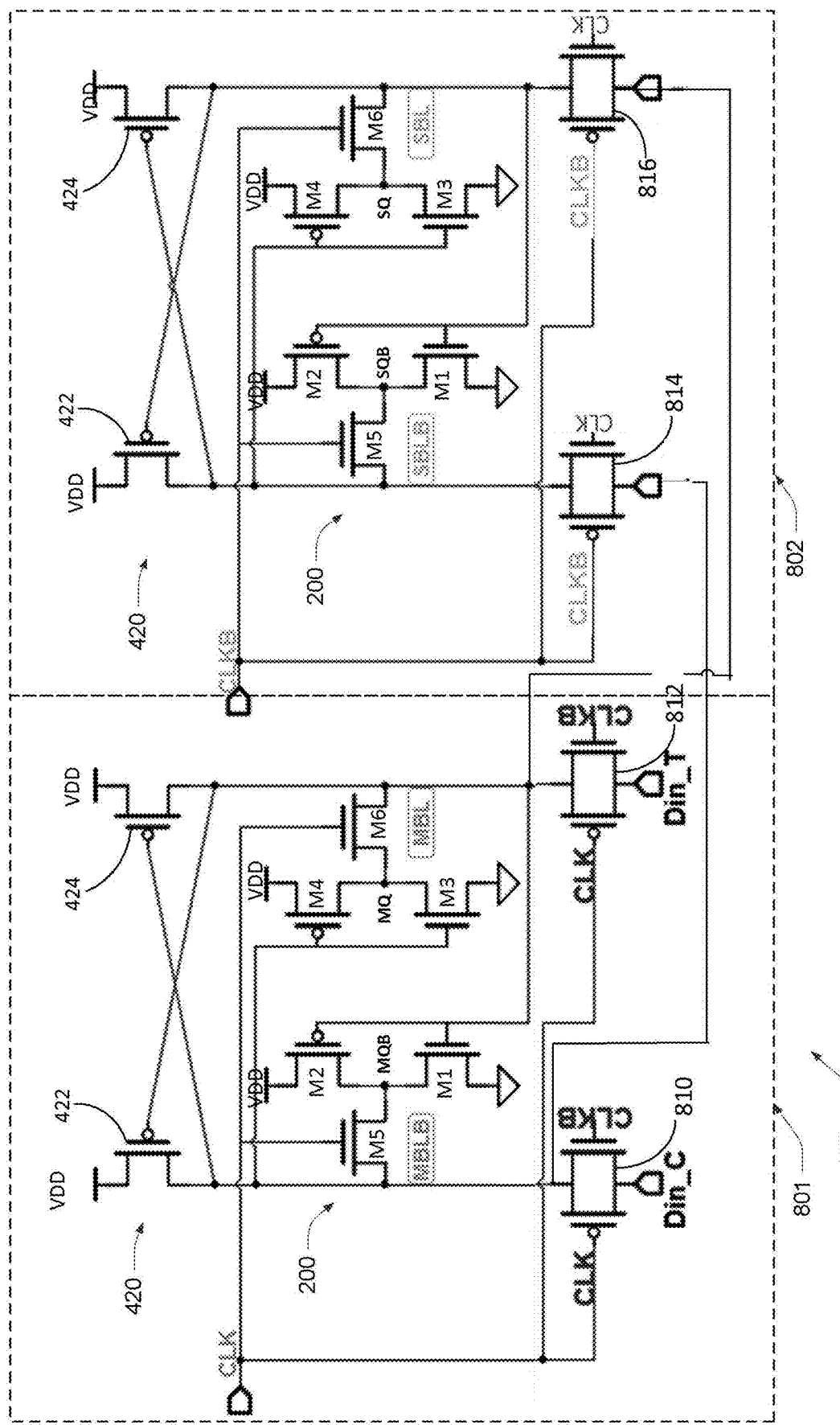
FIG. 8A is a circuit diagram illustrating an example flip-flop in a master-slave latch configuration in accordance with some embodiments.

FIG. 8A is a circuit diagram illustrating an example flip-flop 800a in a master-slave latch configuration utilizing a pair of latch circuits and a pair of cross-coupled P circuits. The flip-flop 800a includes a master latch 801 and slave latch 802.

In the example shown, the master latch 801 includes a first latch circuit 200, though the latch circuit 600 discussed above may equivalently be used. In the example shown, the master latch 801 also includes a master bit line MBL and a complementary master bit line MBLB. An input circuit is included that is similar to that shown in FIG. 4, including transmission gates 810, 812. Clock signals CLK are provided on clock lines formed by the word lines of the memory cell. Complementary clock terminals of the transmission gates 810, 812 receive the CLK signals as well as a complement clock signal CLKB. The transmission gates 810, 812 further receive complementary data inputs Din_C, Din_T at a data input terminal.

The slave latch 802 includes a second latch circuit 200, but the latch circuit 600 may equivalently be used. In the example shown, the slave latch 802 also includes a slave bit line SBL and a slave complementary bit line SBLB, transmission gates 814, 816, and a complementary clock line formed by the word line of the memory cell that receives the complementary clock signal CLKB. However, unlike the master latch 801, the transmission gates 814, 816 of the slave latch 802 have their data input terminals coupled to the bit lines MBLB and MBL.

Figure 8B:
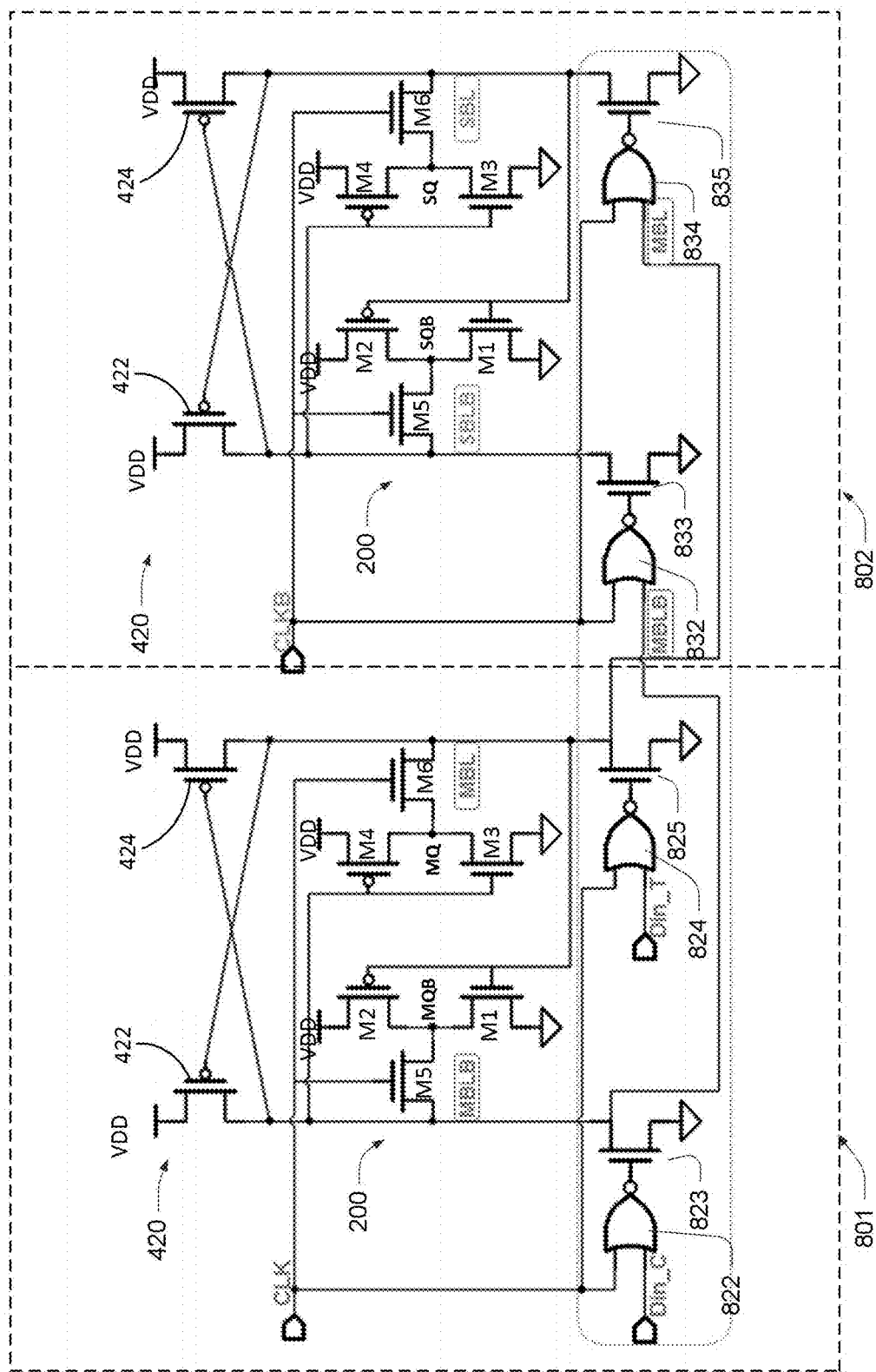
FIG. 8B is a circuit diagram illustrating an example flip-flop in a master-slave latch configuration in accordance with some embodiments.

FIG. 8B is a circuit diagram illustrating another example flip-flop 800b in a master-slave latch configuration utilizing a pair of latch circuits and a pair of cross-coupled P circuits. The flip-flop 800b includes a master latch 801 and slave latch 802.

In the example shown, the master latch 801 includes a first latch circuit 200, though the latch circuit 600 discussed above may equivalently be used. In the example shown, the master latch 801 also includes a master bit line MBL and a complementary master bit line MBLB. An input circuit is included that is similar to that shown in FIG. 5, including NOR gates 822 and 824, NMOS transistors 823 and 825, and a clock line formed by the word line of the memory cell that receives the clock signal CLK. The slave latch 802 includes a second latch circuit 200, but the latch circuit 600 may equivalently be used. In the example shown, the slave latch 802 also includes a slave bit line SBL and a slave complementary bit line SBLB, NOR gates 832 and 834, NMOS transistors 833 and 835, and a complementary clock line formed by the word line of the memory cell to receive the complementary clock signal CLKB. However, unlike the master latch 802, the bit line MBLB is coupled as an input to the NOR gate 832, and the bit line MBL is coupled as in input to the NOR gate 834.

FIG. 8C is a truth table 850 illustrating the operation of the example flip-flops 800a and 800b, according to some embodiments. In the example shown, the truth table 850 includes columns for complementary clock signals CLK and CLKB, complementary data inputs Din_T and Din_C, complementary master latch storage nodes MQ and MQB on master bit lines MBL and MBLB, respectively, and complementary slave latch storage nodes SQ and SQB on slave bit lines SLB and SBLB, respectively. The truth table 850 also includes three rows 852, 854, and 856, corresponding to the three states of the flip-flops 800a and 800b.

The first two rows 852 and 854 of the truth table 850 illustrate the state in which the master latch is held transparent by a CLK 0 signal. The CLK 0 signal is applied to the gates of the access transistors M5 and M6 of the latch circuits 200 for the master latches 801, shutting those transistors "off" and shutting off direct access to the storage node MQB from the complementary bit line MBLB as well as shutting off direct access to the storage node MQ from the bit line MBL. The complement to the CLK 0 signal, e.g. a CLKB 1 signal, is applied to the gates of the access transistors M5 and M6 of the latch circuits 200 in the slave latches 802, opening the M5 and M6 transistors in the slave latches 802. Referring now specifically to the example flip-flop 800a shown in FIG. 8A, the CLK 0 signal and the corresponding complementary CLKB 1 signal open the transmission gates 810 and 812 of the master latch 801, and close the transmission gates 814 and 816 of the slave latch 802. As such, any data applied to the input terminal of the transmission gates of the slave latch 802 does not affect the slave latch 802, e.g. access to the slave latch 802 is shut off by the transmission gates 814 and 816, and the slave latch 802 is in the latched state. Therefore, the slave latch 802 holds its current data regardless of the data inputs Din_T and Din_C, and the storage nodes SQ and SQB store their previous values, respectively, as illustrated in rows 852 and 854 of the truth table 850. Referring now back to the master latch 801 illustrated in FIG. 8A, the transmission gates 810 and 812 are opened by a CLK 0 signal and the corresponding complementary CLKB 1 signal. As such, the master bit line MBL will have the value of the data input Din_T. For the row 852 case of the truth table 850 for a data input signal Din_T of 0, the master bit line MBL will be pulled low. The gate of the PMOS transistor 422 of the cross-coupled P circuit 420 is opened by the low data input signal Din_T 0 on the master bit line MBL, and pulls the complementary master bit line MBLB high by virtue of the first drain/source terminal of the PMOS transistor 422 being connected to VDD and a second drain/source terminal of the PMOS transistor 422 being connected to the complementary bit line MBLB. The gate of the PMOS transistor 424 is connected to the complementary master bit line MBLB, and a high complementary data input signal Din_C 1 on the complementary master bit line MBLB, reinforced by being pulled high via the "opening" of the PMOS transistor 422, closes the PMOS transistor 424. The PMOS transistor 424 has drain/source terminals connected between VDD and the master bit line MBL, and closing the PMOS transistor 424 allows the master bit line MBL to be pulled low. The low data input signal Din_T 0 applied to the master bit line MBL is inverted by the inverter formed by the M1 and M2 transistors, and the storage node MQ is then high, or "1." Similarly, the high complementary data input signal Din_C 1 applied to the complementary master bit line MBLB is inverted by the inverter formed by the M3 and M4 transistors, and the complementary storage node MQB is then low, or "0." Therefore, as illustrated in row 852 of the truth table 850 illustrated in FIG. 8C, for a CLK 0 signal and a low data input signal Din_T 0, the master latch 801 storage node MQ is low and the corresponding complementary storage node MQB is high.

Similarly, for the opposite data inputs when the clock input is low, e.g. row 854 in the truth table 850 where the clock signal is CLK 0 and the data input is high, e.g. Din_T 1, the master latch 801 storage node MQ follows the data input Din_T and is also high, and the complementary storage node MQB follows the complementary data input Din_C and is low. That is, a high data input Din_T will drive the MBL high, reinforce a low at MQB through the inverter formed by the transistors M1 and M2, and shut off the PMOS transistor 422 allowing MBLB to be pulled low by Din_C. The corresponding low data input Din_C will pull MBLB low, reinforce the high at MQ through the inverter formed by the transistors M3 and M4, and open the PMOS transistor 424 allowing MBL to be pulled high by VDD. In this way, the master latch 801 is "transparent" when a low clock signal is applied, e.g. CLK 0, such that the storage nodes MQ and MQB follow the data input Din_T and complementary data input Din_C, respectively. Also, the low clock signal CLK 0 latches the slave latch 802, which holds its data at storage nodes SQ and SQL.

Referring now to flip-flop 800*b* shown in FIG. 8B, the master latch 801 is similarly "transparent" when a low clock signal is applied, and the slave latch 802 is similarly latched. The operation of the latch circuit 200 and the cross-coupled P circuits 420 in the master latch 801 and the slave latch 802 are the same as described above in conjunction with the flip-flop 800*a* shown in FIG. 8A. The difference between the flip-flop 800*b* embodiment and the flip-flop 800*a* embodiment is the circuit allowing access to the data input Din_T and the complementary data input Din_C. The embodiment shown in FIG. 8B utilizes the NOR gates 822, 824, 832, and 834 in combination with transistors 823, 825, 833, and 835. For example, for the row 852 case in the truth table 850 where the clock signal is low, e.g. CLK 0, and the data input is low, e.g. Din_T is 0, the clock signal and the data input signal Din_T are the inputs into the NOR gate 824 of the master latch 801. The output of the NOR gate 824 is connected to the gate of the transistor 825, and for both CLK 0 and Din_T 0, the NOR gate outputs a high, e.g. a "1," opening the transistor 825. The source/drain terminals of the transistor 825 is connected between the master bit line MBL and ground, and pulls the MBL low. As described above regarding the master latch 801, when the MBL is pulled low in the latch circuit 200 of the master latch 801, the low signal on the MBL is inverted by the inverter formed by the M1 and M2 transistors and the storage node MQ will be high, e.g. "1," and the PMOS transistor 422 will open and the complementary bit line MBLB will be pulled high via its connection to VDD through the source/drain terminals of the PMOS transistor 422. The inputs to the NOR gate 822 are the clock signal and the complementary data input Din_C, which for this case are CLK 0 and Din_C 1, and the output of the NOR gate 822 will be low, or "0." The output of the NOR gate 822 is connected to the gate of the transistor 823, which has its source/drain terminals connected between the complementary master bit line MBLB and ground. The low output of the NOR gate 822 shuts off the transistor 823 isolating the complementary master bit line MBLB from ground and allowing the complementary master bit line MBLB to be pulled high. The high signal on the complementary master bit line MBLB is inverted by the inverter formed by the transistors M3 and M4 and the complementary storage node MQB will be high, or "1." The high signal on the complementary master bit line MBLB also shuts off the PMOS transistor 424, isolating the master bit line MBL from VDD and allowing it to be pulled low via its connection to ground through the transistor 825. Regarding the slave latch 802, the inputs of both the NOR gates 832 and 854 are connected to the complementary clock signal CLKB 1, and the output of both NOR gates 832 and 834 will be low, e.g. "0," isolating the slave latch 802, and the slave latch 802 is in the latched state. The NOR gates of the master latch 801 and slave latch 802 operate similarly for the row 1004 case of the truth table 1000, where the clock signal is still low, e.g. CLK 0, and the data input is high, e.g. Din_T 1, and the complementary data input is low, e.g. Din_C 0. As such, and similar to the flip-flop 800, the master latch 801 is transparent when the clock signal is low such that the storage node MQ follows the data input Din_T and the complementary storage node MQB follows the data input Din_C. Also, the slave latch 802 is latched.

Referring now back to FIG. 8A, the row 856 of the truth table 850 will be discussed. Specifically, for a clock signal CLK 1, the master latch 801 will be latched and its data stored in the storage node MQ and the complementary storage node MQB will be written to the slave latch storage node SQ and the slave latch complementary storage node SQB, respectively. As illustrated in FIG. 8A, the CLK 1 signal closes the transmission gates 810 and 812, isolating the latch circuit 200 from the data input Din_T and the complementary data input Din_C. The corresponding complementary clock signal CLKB 0 opens the transmission gates 814 and 816 connected to the complementary slave bit line SBLB and the slave bit line SBL, respectively. The data input to the slave bit line SBL is the master latch bit line, MBL, and the data input to the complementary slave bit line SBLB is the complementary master bit line MBLB. The CLK 1 signal opens the access transistors M5 and M6 of the latch circuit 200 of the master latch 801. The opening of the access transistors M5 and M6 of the master latch 801 drives the master bit line MBL to the value stored in the storage node MQ and the complementary master bit line MBLB to the value stored in the complementary storage node MQB. For example, if the storage node MQ stores a high, e.g. "1," and the complementary storage node MQB stores a "0," the high on the storage node MQ will drive the master bit line MBL high, thereby shutting off the PMOS transistor 422 and allowing the low at the complementary storage node MQB to pull the complementary master bit line MBLB low. The low on the complementary master bit line MBLB opens the PMOS transistor 424, reinforcing the high on the master bit line MBL. The complementary clock signal CLKB 0 closes the access transistors M5 and M6 of the latch circuit 200 of the slave latch 802, and the slave latch 802 operates as the master latch 801 with a CLK 0 signal applied as described above. That is, the master bit line serves as the equivalent of the data input Din_T and the complementary master bit line MBLB serves as the equivalent of the complementary data input Din_C. As such, for a CLK 1 signal, the master latch storage node MQ is written to the slave latch storage node SQ, and the complementary master latch storage node MQB is written to the complementary slave latch storage node SQB, as illustrated in row 856 of the truth table 850 of FIG. 8C.

Figure 9:
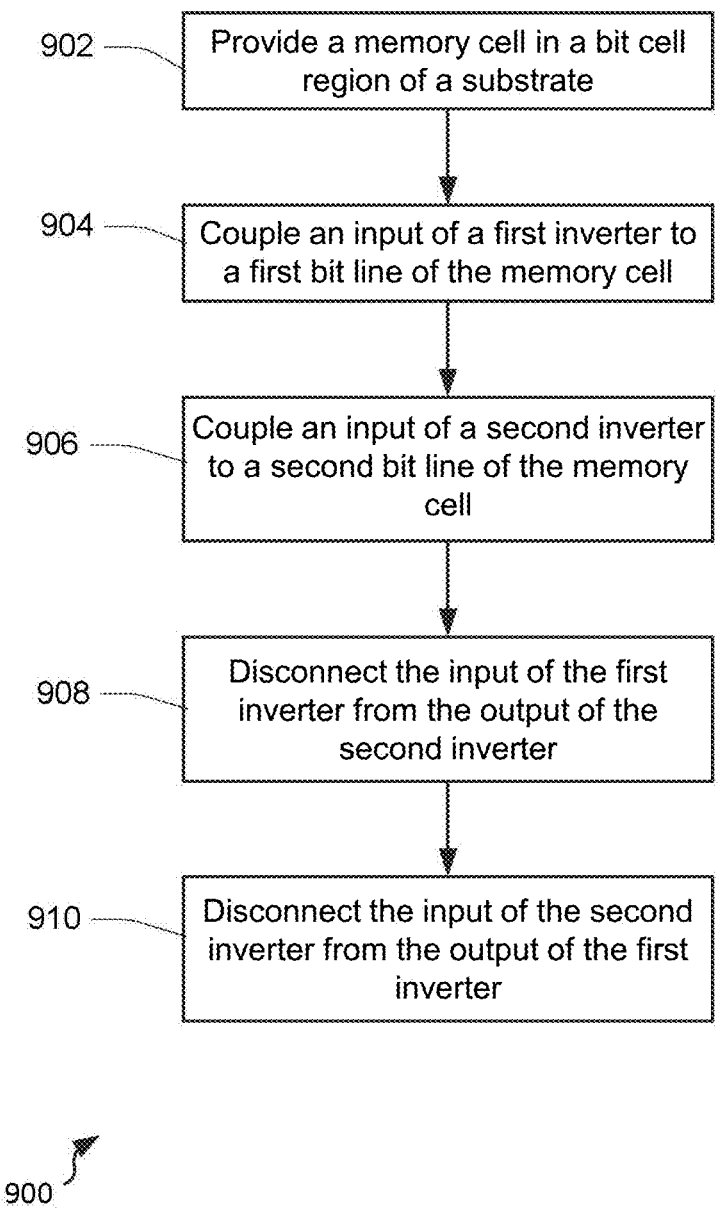
FIG. 9 is a flowchart of an example method for forming a latch circuit, according to some embodiments.

FIG. 9 is a flowchart illustrating an example of a method 900 for forming a latch circuit, such as the circuit 200 disclosed herein. In the example shown, the method 900 includes providing a first memory cell in a bit-cell region of a substrate at step 902, for example, an SRAM memory bit-cell 200 in the bit-cell region 12 of the substrate 14. As discussed above, the memory cell may be a six-transistor (6T) SRAM structure, but is not limited to a 6T SRAM structure. In alternative embodiments an SRAM bit-cell having more or fewer than six transistors may be used. For example, the memory cell in some embodiments of method 900 may use a 4T, 8T or 10T SRAM structure, and in other embodiments may include a memory-like bit-cell or a building unit. In the example shown, the method 900 includes coupling the input of the first inverter 310 of the memory cell to a first bit line BL at step 904, and coupling the input of the second inverter 312 of the memory cell to the second bit line BLB at step 906, for example by extending inverter coupling lines 212, 214 in the MD layer to couple the inverter inputs to the bit lines of the memory cell. In the example shown, the method 900 includes disconnecting the input of the first inverter 310 from the output of the second inverter 312 at step 908, for example by omitting, or cutting or disconnecting the cross-coupling line 202 via disconnection of the gate connections of the transistors forming the first inverter 310 from the source/drain terminals of the transistors forming the second inverter 312 and the source/drain terminal of the second access transistor and the storage node Q in the MP layer of the memory cell. In the example shown, the method 900 includes disconnecting the input of the second inverter 312 from the output of the first inverter 310 at step 910, for example by cutting, omitting or disconnecting the cross-coupling lines 204 by disconnection of the gate connections of the transistors forming the second inverter 312 from the source/drain terminals of the transistors forming the first inverter 310 and the source/drain terminal of the first access transistor and the storage node Qbar in the MP layer in the memory cell.

Figure 10:
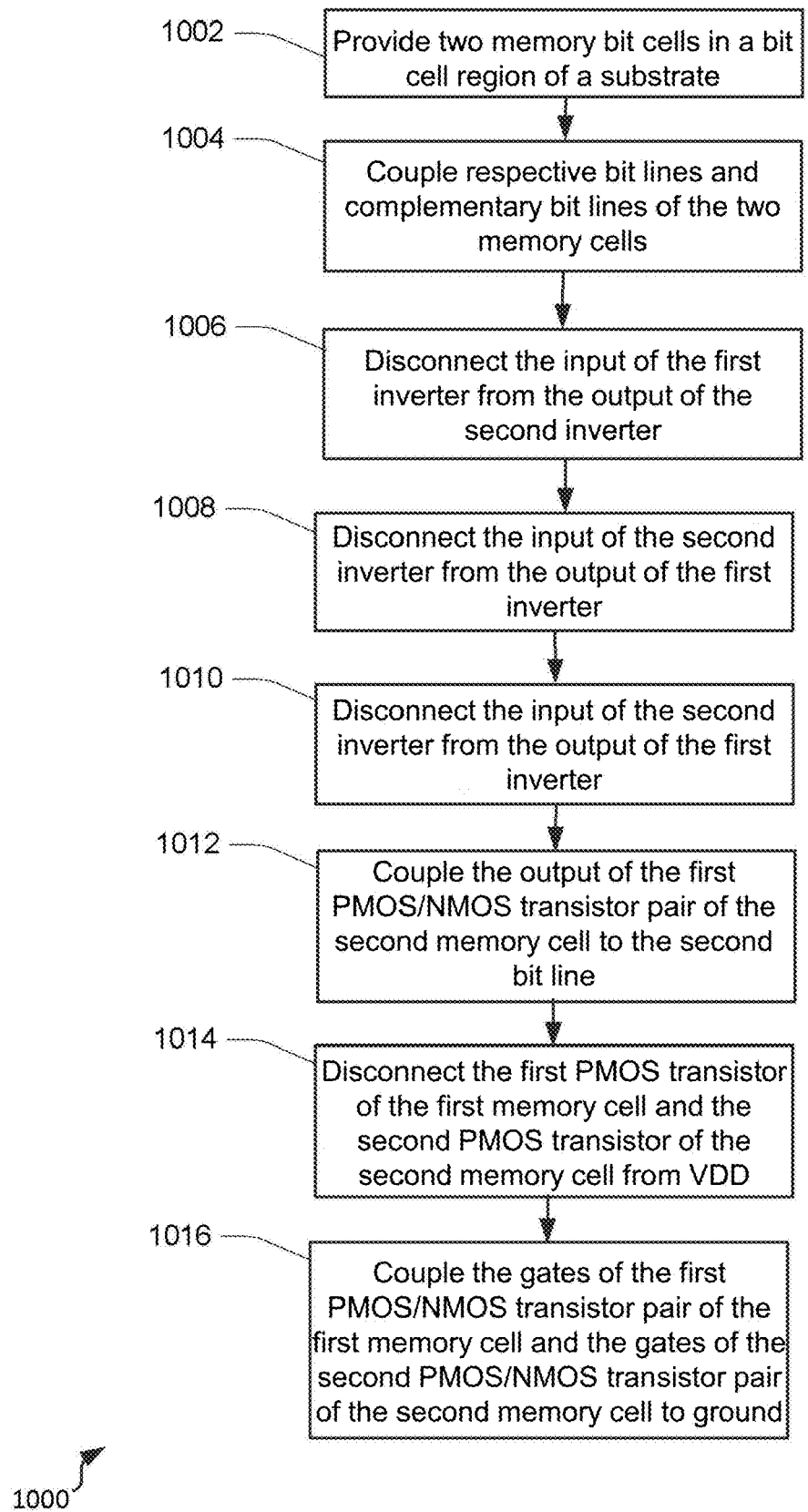
FIG. 10 is a flowchart of another method for forming a latch circuit according to some embodiments.

FIG. 10 is a flowchart of another method 1000 for forming a latch circuit, such as the latch circuit 600 shown in FIGS. 6 and 7. The method can be performed, for example, on two SRAM memory cells and involve modifications to only the MP and VG layers. In the example shown, the method 1000 includes providing two SRAM memory bit-cells for modification at step 1002, such as the bit-cells 601 and 603 shown in FIGS. 6A and 6B. As discussed above, one or both of the memory cells may be six-transistor (6T) SRAM structure. In some embodiments more or fewer than six transistors may be used. For example, one or both of the memory cells in some embodiments of method 1000 may use a 4T, 8T or 10T SRAM structure, and in other embodiments may include a memory-like bit-cell or a building unit.

In the example shown, the method 1000 includes coupling together the bit lines BL of both SRAM memory cells, and also coupling together the complementary bit lines BLB of both SRAM memory cells at step 1004. In step 1006, the coupling line 202 in the MP layer of the first bit-cell 601 is omitted or disconnected to disconnect the input of one inverter of the first bit-cell 601 from the output of the other inverter of the first bit-cell 601. For example, the gate connections of the transistors forming the first inverter 702 in the first bit-cell 601, e.g. M3 and M4, are omitted, or cut or disconnected, from the source/drain terminals of the transistors forming the other inverter of the first bit-cell 601, e.g. M1 and M2, and the source/drain terminal of the second access transistor of the first bit-cell 601, e.g. M6, and the storage node Q in the MP layer of the memory cell. Similarly, the coupling line 604 in the MP layer of the second bit-cell 603 is omitted or disconnected to disconnect the input of one inverter of the second bit-cell 603 from the output of the other inverter of the second bit-cell 603 in step 1008. For example, the gate connections of the transistors forming the second inverter 704 in the second bit-cell 603, e.g. M7 and M8, are omitted, or cut or disconnected, from the source/drain terminals of the transistors forming the other inverter of the second bit-cell 603, e.g. M9 and M10, and the source/drain terminal of the first access transistor of the second bit-cell 603, e.g. M11, and the storage node Qbar in the MP layer of the memory cell. In contrast with the latch circuit 200, however, the coupling lines 204 and 602 remain as shown in FIG. 6A.

In step 1010 the output of the inverter formed by the PMOS/NMOS transistor pair M1, M2 of the first memory cell 601 is coupled to the first bit line BLB by the connecting line 622 in the VG layer. For example, the common connection of the source/drain terminals of the M1, M2, and M5 transistors is connected to the complementary bit line BLB of the first bit-cell 601 in the VG layer. In step 1012, the output of the PMOS/NMOS transistor pair M9, M10 of the second memory cell 603 is connected to the second bit line BL by the connecting line 624 in the VG layer. For example, the common connection of the source/drain terminals of the M9, M10, and M12 transistors is connected to the bit line BL of the second bit-cell 603 in the VG layer. At step 1014, the first PMOS transistor of the first bit-cell and the second PMOS transistor of the second bit-cell are disconnected from VDD in the VG layer and are left floating. That is, the source/drain terminal of the transistor M2 of the bit-cell 601 and the source/drain terminal of the transistor M10 of the bit-cell 603 are disconnected from VDD. At step 1016, the gates of the first PMOS/NMOS transistor pair of the first memory cell and the gates of the second PMOS/NMOS transistor pair of the second memory cell are connected to low, e.g. ground, in the MP layer. That is, the gates of the transistors M1 and M2 of the bit-cell 601 and the gates of the transistors M9 and M10 of the bit-cell 603 are connected to ground in the MP layer By completing the latch/flip-flop by the bit-cell array layout rule, area is saved. The data/signal propagation is faster due to location of the read-out/data-in the latch next to the bit-cell array. Further, power consumption is reduced because of shorter data path/circuit connection with smaller parasitic RC.

Thus, disclosed embodiments include a circuit that includes a clock input terminal configured to receive a clock signal, and complementary first and second data terminals. A first latch circuit includes first and second inverters, where the first inverter has an input terminal coupled to the first data terminal, and the second inverter having an input terminal coupled to the second data terminal. A first pass gate transistor is coupled between an output terminal of the second inverter and the first data terminal, and a second pass gate transistor coupled between an output terminal of the first inverter and the second data terminal. The first and second pass gate transistors each have a gate terminal coupled to the clock input terminal. The input terminal of the first inverter is not directly connected to the output terminal of the second inverter, and the input terminal of the second inverter is not directly connected to the output terminal of the first inverter.

In accordance with other disclosed embodiments, an integrated circuit includes a substrate having a bit-cell region and a periphery region outside the bit-cell region. A plurality of SRAM bit-cells are formed in the bit-cell region. A latch circuit is formed in the bit-cell region and is coupled to at least one of the plurality of SRAM bit-cells.

In accordance with still further disclosed embodiments, a method of forming a latch circuit includes providing a first memory cell in a bit-cell region of a substrate that includes a word line and first and second complementary bit lines. The first memory cell has a first inverter that includes a first PMOS/NMOS transistor pair, a second inverter that includes a second PMOS/NMOS transistor pair, a first pass gate transistor that is coupled between the first bit line and an output of the second inverter, with a gate coupled to the word line. The memory cell further includes a second pass gate transistor coupled between the second bit line and an output of the first inverter and has a gate coupled to the word line. The first memory cell is modified by coupling the gates of the first PMOS/NMOS transistor pair directly to the first bit line. The method further includes coupling the gates of the of the second PMOS/NMOS transistor pair directly to the second bit line, and coupling the word line to receive a clock signal.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a latch circuit, comprising:
providing a first memory cell comprising:
  a word line;
  first and second bit lines;
  first and second inverters, the first inverter having an output directly connected to an input of the second inverter by a first cross-coupling line, the second inverter having an output directly connected to an input of the first inverter by a second cross-coupling line;
  a first pass gate transistor coupled between the first bit line and the output of the second inverter and having a gate coupled to the word line;
  a second pass gate transistor coupled between the second bit line and the output of the first inverter and having a gate coupled to the word line;
cutting the first cross-coupling line to decouple the output of the first inverter from the input of the second inverter;
cutting the second cross-coupling line to decouple the output of the second inverter from the input of the first inverter;
directly coupling the input of the first inverter to the first bit line by a first coupling line;
directly coupling the input of the second inverter to the second bit line by a second coupling line; and
coupling the word line to receive a clock signal.

2. The method of claim 1, wherein the first memory cell is provided in a bit-cell region of a substrate.

3. The method of claim 1, wherein the first inverter comprises a first PMOS/NMOS transistor pair, the second inverter comprises a second PMOS/NMOS transistor pair, wherein the method further comprises:
coupling the gates of the first PMOS/NMOS transistor pair directly to the first bit line; and
coupling the gates of the of the second PMOS/NMOS transistor pair directly to the second bit line.

4. The method of claim 3, wherein the provided first memory cell includes the gates of the first PMOS/NMOS transistor pair being coupled to the output of the second inverter, and the gates of the second PMOS/NMOS transistor pair being coupled to the output of the first inverter, the method further comprising:
decoupling the gates of the first PMOS/NMOS transistor pair from the output of the second inverter and decoupling the gates of the second PMOS/NMOS transistor pair from the output of the first inverter.

5. The method of claim 4, wherein decoupling the gates of the first PMOS/NMOS transistor pair from the output of the second inverter and disconnecting the gates of the second PMOS/NMOS transistor pair from the output of the first inverter include modifying an MP layer of the first memory cell.

6. The method of claim 3, wherein coupling the gate of the first PMOS/NMOS transistor pair to the first bit line, and coupling the gates of the second PMOS/NMOS transistor pair to the second bit line include modifying an MD layer of the first memory cell.

7. The circuit of claim 3, further comprising:
a complementary clock input terminal configured to receive a complementary clock signal;
third and fourth bit lines;
a second latch circuit comprising:
third and fourth inverters, the third inverter having an input terminal coupled to the third bit line, the fourth inverter having an input terminal coupled to the fourth bit line; and
third and fourth pass gate transistors, the third pass gate transistor coupled between an output terminal of the fourth inverter and the third bit line, the fourth pass gate transistor coupled between an output terminal of the third inverter and the fourth bit line, the third and fourth pass gate transistors each having a gate terminal coupled to the complementary clock input terminal;
third and fourth cross-coupled PMOS transistors;
wherein the third cross-coupled PMOS transistor is coupled between the first voltage terminal and the fourth bit line, and has a gate coupled to the third bit line;
wherein the fourth cross-coupled PMOS transistor is coupled between the first voltage terminal and the third bit line, and has a gate terminal coupled to the fourth bit line.

8. The method of claim 1, further comprising:
providing first and second voltage terminals;
coupling a first PMOS transistor between the first voltage terminal and the first bit line;
coupling a gate of the first PMOS transistor to the second bit line;
coupling a second PMOS transistor between the first voltage terminal and the second bit line; and
coupling a gate of the second PMOS transistor to the first bit line.

9. The method of claim 8, further comprising:
coupling a first data input transistor between the first bit line and the second voltage terminal;
coupling a first input terminal of a first NOR gate to the word line to receive the clock signal;
coupling a second input terminal of the first NOR gate to receive a data input signal;
coupling an output terminal of the first NOR gate to a gate of the first data input transistor;
coupling a second data input transistor between the second bit line and the second voltage terminal;
coupling a first input terminal of a second NOR gate to the word line to receive the clock signal;
coupling a second input terminal of the second NOR gate to receive a complement of the data input signal; and
coupling an output terminal of the second NOR gate to a gate of the second data input transistor.

10. The method of claim 1, further comprising:
coupling an output of a first transmission gate to the first bit line;
coupling a first clock input of the first transmission gate to the word line to receive the clock signal;
coupling a second clock input of the first transmission gate to receive a complement of the clock signal;
coupling an input terminal of the first transmission gate to receive a data input signal;
coupling an output of a second transmission gate to the second bit line;
coupling a first clock input of the second transmission gate to the word line to receive the clock signal;
coupling a second clock input of the second transmission gate to receive the complement of the clock signal;
coupling an input terminal of the second transmission gate to receive a complement of the data input signal.

11. A method, comprising:
providing a substrate having a bit-cell region and a periphery region outside the bit-cell region;
forming a plurality of SRAM bit-cells in the bit-cell region often substrate, wherein each of the SRAM bit-cells includes:
a word line;
first and second bit lines;
first and second inverters, the first inverter having an output directly connected to an input of the second inverter by a first cross-coupling line, the second inverter having an output directly connected to an input of the first inverter by a second cross-coupling line;
a first pass gate transistor coupled between the first bit line and the output of the second inverter and having a gate coupled to the word line;
a second pass gate transistor coupled between the second bit line and the output of the first inverter and having a gate coupled to the word line;
modifying at least one of the plurality of SRAM bit-cells to form a latch circuit in the bit-cell region, including;
cutting the first cross-coupling line to decouple the output of the first inverter from the input of the second inverter;
cutting the second cross-coupling line to decouple the output of the second inverter from the input of the first inverter;
directly coupling the input of the first inverter to the first bit line by a first coupling line;
directly coupling the input of the second inverter to the second bit line by a second coupling line; and
coupling the line to receive a clock signal; and
receiving and latching an output of at least one of the plurality of SRAM bit-cells in the bit-cell region by the latch circuit formed in the bit-cell.

12. The method of claim 11, further comprising:
coupling a first PMOS transistor between a voltage terminal and the first bit line;
coupling a second PMOS transistor between the voltage terminal and the second bit line;
coupling a gate terminal of the first PMOS transistor to the second bit line; and
coupling a gate terminal of the second PMOS transistor to the first bit line.

13. The method of claim 11, further comprising:
coupling a first transmission gate between a first data input and the first bit line;
coupling a second transmission gate between a second data input and the second bit line; and
coupling the clock signal input to a gate terminal of the first and second transmission gates.

14. The method of claim 11, further comprising:
coupling a first input transistor between a first data input and the first bit line;
coupling a second input transistor between a second data input and the second bit line;
coupling a first NOR gate to a gate terminal of the first input transistor;
coupling a second NOR gate to a gate terminal of the second input transistor;
coupling the clock signal input to a first input terminal of each of the first and second NOR gates;
coupling a first input terminal to a second input terminal of the first NOR gate; and
coupling a second input terminal to a second input terminal of the second NOR gate.

15. A latch circuit, comprising:
a first memory cell comprising:
a word line;
fist and second bit lines;
first and second inverters, the first inverter having an input terminal and an output terminal, the second inverter having an input terminal and an output terminal;
a first cross-coupling line extending directly between the output terminal of the first inverter and the input terminal of the second inverter;
a second cross-coupling line extending directly between the output terminal of the second inverter and the input terminal of the first inverter; and
first and second pass gate transistors, the first pass gate transistor coupled between the output terminal of the second inverter and the first bit line, the second pass gate transistor coupled between the output terminal of the first inverter and the second bit line, the first and second pass gate transistors each having a gate terminal coupled to the word line;
wherein the first cross-coupling line and the second-cross coupling line are cut;
wherein a first coupling line directly couples the input of the first inverter to the first bit line;
wherein a second coupling line directly couples the input of the second inverter to the second bit line, and
wherein the word line is coupled to a clock input terminal to receive a clock signal.

16. The circuit of claim 15, wherein:
the first inverter comprises:
a first PMOS transistor coupled between a first voltage terminal and the second pass gate transistor, the first PMOS transistor having a gate coupled to the first data terminal;
a first NMOS transistor coupled between a second voltage terminal and the second pass gate transistor, the first NMOS transistor having a gate coupled to the first data terminal; and
the second inverter comprises:
a second PMOS transistor coupled between the first voltage terminal and the first pass gate transistor, the second PMOS transistor having a gate coupled to the second data terminal;
a second NMOS transistor coupled between the second voltage terminal and the first pass gate transistor, the second NMOS transistor having a gate coupled to the second data terminal.

17. The circuit of claim 15, further comprising:
first and second voltage terminals;
first and second cross-coupled PMOS transistors;
wherein the first cross-coupled PMOS transistor is coupled between the first voltage terminal and the second bit line, and has a gate coupled to the first bit line;
wherein the second cross-coupled PMOS transistor is coupled between the first voltage terminal and the first bit line, and has a gate terminal coupled to the second bit line.

18. The circuit of claim 17, further comprising:
first and second data input terminals;
first and second transmission gates; wherein:
the first transmission gate is coupled between the first data input terminal and the first bit line, and has a gate coupled to the clock input terminal;
the second transmission gate is coupled between the second data input terminal and the second bit line, and has a gate coupled to the clock input terminal.

19. The circuit of claim 17, further comprising:
first and second data input terminals;
first and second NOR gates, the first NOR gate having a first input terminal coupled to the first data input terminal and a second input terminal coupled to the clock input terminal, the second NOR gate having a first input terminal coupled to the second data input terminal and a second input terminal coupled to the clock input terminal;
a first input transistor coupled between the second voltage terminal and the first bit line, and having a gate coupled to an output of the first NOR gate;
a second input transistor coupled between the second voltage terminal and the second bit line, and having a gate coupled to an output of the second NOR gate.

20. The circuit of claim 15, further comprising:
a substrate having a bit-cell region and a periphery region outside the bit-cell region;
wherein the latch circuit is formed in the bit-cell region.

21. The circuit of claim 20, further comprising:
a plurality of SRAM bit-cells formed in the bit-cell region; and
wherein the latch circuit is coupled to at least one of the plurality of SRAM bit-cells.

\* \* \* \* \*